United States Patent
Shin et al.

(10) Patent No.: US 7,226,804 B2
(45) Date of Patent: Jun. 5, 2007

(54) METHOD FOR FORMING PATTERN OF ORGANIC INSULATING FILM

(75) Inventors: Jung Han Shin, Gyeonggi-do (KR);
Joon Yong Park, Gyeonggi-do (KR);
Min Seong Ryu, Gyeonggi-do (KR);
Young Mok Son, Gyeonggi-do (KR);
Sang Yoon Lee, Seoul (KR)

(73) Assignee: Samsung Electronic Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/195,694

(22) Filed: Aug. 3, 2005

(65) Prior Publication Data

US 2006/0115998 A1    Jun. 1, 2006

(30) Foreign Application Priority Data

Nov. 30, 2004    (KR)    ............. 10-2004-0099161

(51) Int. Cl.
*H01L 21/00*    (2006.01)
(52) U.S. Cl. .............. 438/82; 438/99; 438/22
(58) Field of Classification Search .......... 438/82, 438/99, 22, 57; 257/40; 428/690
See application file for complete search history.

(56) References Cited

U.S. PATENT DOCUMENTS

2003/0228718 A1* 12/2003 Murti et al. ............. 438/99
2006/0006380 A1*  1/2006 Shin et al. .............. 257/40

OTHER PUBLICATIONS

S. Chou et al., Nanoprint lithography, J.Vac. Sci. Technol. B, Nov./Dec. 1996, pp. 4129-4133, vol. 14, No. 6.
CH. Pannemann et al., Nanometer scale organic thin film transistors with Pentacene, Microelectric Engineering 67-68, 2003, pp. 845-852.

* cited by examiner

*Primary Examiner*—Hsien-Ming Lee
(74) *Attorney, Agent, or Firm*—Buchanan Ingersoll & Rooney PC

(57) ABSTRACT

A method for forming a pattern of an organic insulating film by forming an electrode on a substrate, coating an imprintable composition thereon to form an organic insulating film, pressurizing and curing the organic insulating film using a patterned mold to transfer a pattern of the mold to the organic insulating film, and etching a portion of the organic insulating film remaining on the electrode. Since a pattern of an organic insulating film can be formed by simple molding without the use of a photoresist, the overall procedure is simplified and eventually an organic thin film transistor with high charge carrier mobility can be fabricated by all wet processes.

8 Claims, 4 Drawing Sheets ( unit :μm)

( unit :μm)

METHOD FOR FORMING PATTERN OF ORGANIC INSULATING FILM

BACKGROUND OF THE INVENTION

This non-provisional application claims priority under 35 U.S.C. § 119(a) on Korean Patent Application No. 2004-99161 filed on Nov. 30, 2004, which is herein expressly incorporated by reference.

FIELD OF THE INVENTION

The embodiments of the present invention relates to a method for forming a pattern of an organic insulating film, and more particularly to a method for forming a pattern of an organic insulating film by forming an electrode on a substrate, coating an imprintable composition thereon to form an organic insulating film, pressurizing and curing the organic insulating film using a patterned mold to transfer a pattern of the mold to the organic insulating film, and etching a portion of the organic insulating film remaining on the electrode.

DESCRIPTION OF THE RELATED ART

In recent years, polymer materials have been actively investigated as novel electrical and electronic materials in a wide variety of applications, e.g., functional electronic and optical devices, on account of their easy molding into fibers and films, superior flexibility, high conductivity and low manufacturing costs. From among devices fabricated by using these electrically conductive polymers, research on organic thin film transistors fabricated by using organic materials as semiconductor active layers has been conducted since the 1980's. Organic thin film transistors can be fabricated by simple processes, such as printing, at low cost. In addition, organic thin film transistors are advantageous in that they have good treatment and interchangeability with flexible substrates. Based on these advantages, a number of studies are now being actively undertaken around the world. Organic thin film transistors are expected to be useful for driving devices of active displays and plastic chips for use in smart cards and inventory tags.

On the other hand, in order to apply organic thin film transistors to the display devices, it is necessary to form patterns of organic insulating films for interconnect of electrodes. Photolithography has been employed to form patterns of organic insulating films until now. For photolithography, organic insulating films must satisfy the following additional requirements. That is, the organic insulating films must be compatible with photoresists. In addition, the organic insulating films must have superior thermal resistance and etch resistance to the photoresists so as not to be influenced by heating and etching during photolithography. Furthermore, the organic insulating films must have sufficient chemical resistance against a photoresist stripper to avoid the influence when exposed to the stripper.

In the choice of suitable compositions for forming organic insulating films, the above-mentioned requirements should be taken into consideration. Accordingly, the compositions are very limited in their use. The choice of unsuitable compositions inevitably causes poor electrical properties, and makes the fabrication of organic thin film transistors by all-wet processes difficult. Thus, there exists a need in the art for a method for forming a pattern of an organic insulating film in a simple manner without the use of a photoresist.

In this connection, J. Vac. Sci. Technol. B, Vol. 14, No. 6, November/December 1996 describes a method for transferring a pattern by coating a resist on a substrate, imprinting the resist by molding, demolding, and removing the remaining resist by etching. However, this method has the limitation that it is not applied to organic thin film transistors.

Microelectronic Engineering, 67–68 (2003), 845–852 discloses a method for forming a pattern of source/drain electrodes by forming a $SiO_2$ insulating film on a Si substrate, forming metal electrodes on the insulating film by deposition, coating a polymethylmethacrylate (PMMA) resist on the electrodes, followed by molding and etching. However, the application of this method is limited to patterns of source/drain electrodes.

OBJECTS AND SUMMARY

Therefore, the embodiments of the present invention have been made in view of the above problems of the art, and it is an object of the embodiments of the present invention to provide a method for forming a pattern of an organic insulating film by simple molding without the use of a photoresist, thereby simplifying the overall procedure and eventually enabling fabrication of an organic thin film transistor with high charge carrier mobility by all wet processes.

In accordance with one aspect of the present invention for achieving the above object, there is provided a method for forming a pattern of an organic insulating film by forming an electrode on a substrate, coating an imprintable composition thereon to form an organic insulating film, pressurizing and curing the organic insulating film using a patterned mold to transfer a pattern of the mold to the organic insulating film, and etching a portion of the organic insulating film remaining on the electrode.

In accordance with another aspect of the present invention, there is provided an organic insulating film patterned by a method according to an embodiment of the present invention.

In accordance with another aspect of the present invention, there is provided an organic thin film transistor comprising a substrate, a gate electrode, an organic insulating film, an organic semiconductor layer and source-drain electrodes wherein the organic insulating film is the organic insulating film patterned by a method according to an embodiment of the present invention.

In accordance with still another aspect of the present invention, there is provided a display device comprising an organic thin film transistor patterned by a method according to an embodiment of the present invention.

BRIEF DESCRIPTION OF THE DRAWINGS

The above and other objects, features and other advantages of the embodiments of the present invention will be more clearly understood from the following detailed description taken in conjunction with the accompanying drawings, in which.

DETAILED DESCRIPTION OF THE PREFERRED EMBODIMENTS

The embodiments of the present invention will now be described in more detail with reference to the accompanying drawings.

Figure 1:
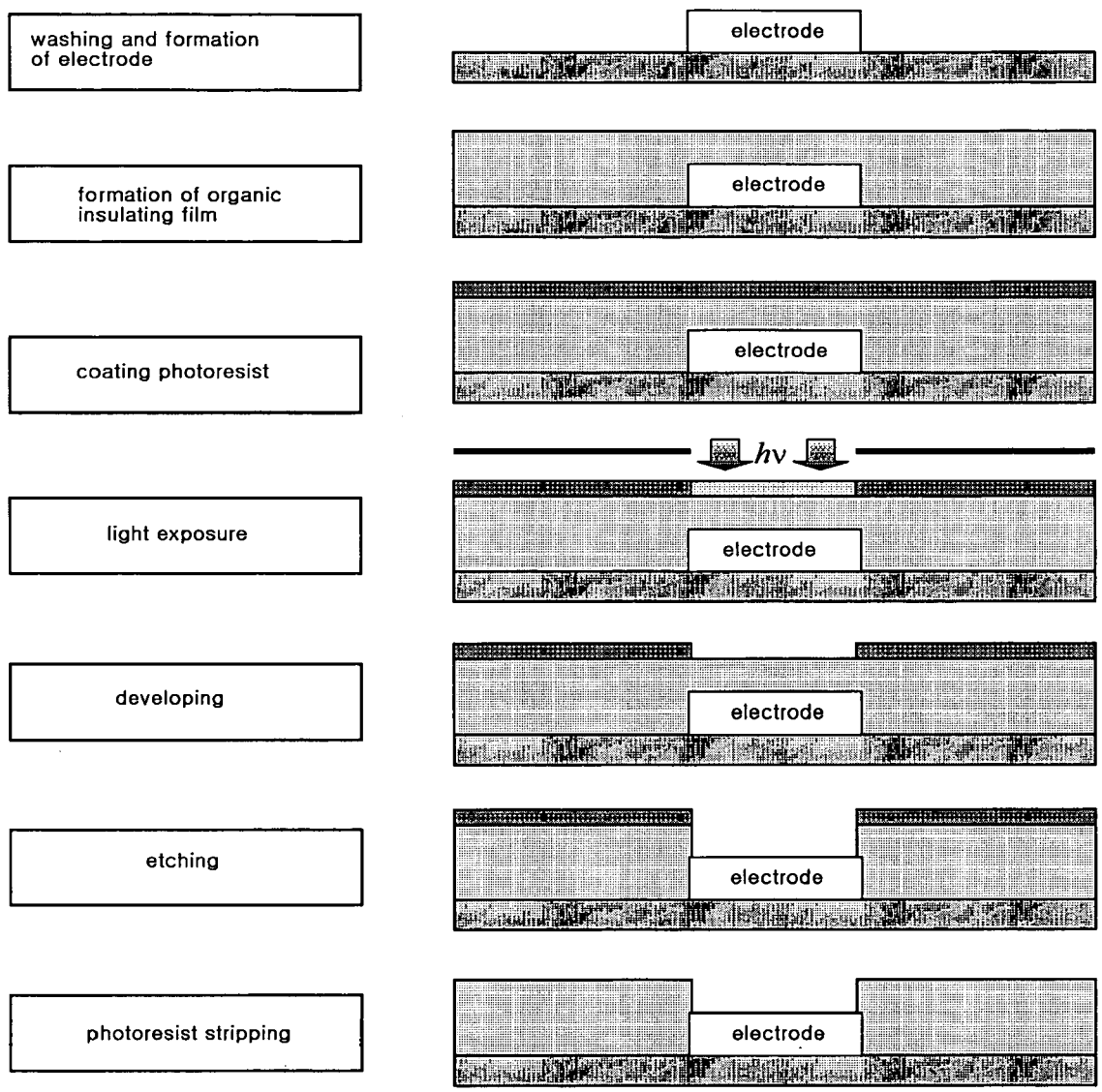
FIG. 1 is a schematic diagrammatic representation illustrating the steps of a conventional method for forming a pattern of an organic insulating film on an electrode connected to a driving circuit.

FIG. 1 is a schematic diagrammatic representation illustrating the steps of a conventional method for forming a pattern of an organic insulating film by photolithography. Based on the respective steps, first, an electrode is formed on a previously washed substrate, and then an organic insulating film is formed thereon. Thereafter, a photoresist is coated on the organic insulating film, and is then developed to expose a region where a pattern is formed through a photomask by light exposure. After the underlying organic insulating film is dry- or wet-etched using the patterned photoresist as a shadow mask, the photoresist is removed using a photoresist stripper to complete the formation of a pattern of an organic insulating film.

The embodiments of the present invention are characterized in that a pattern of an organic insulating film is formed by simple molding instead of general photolithography.

Figure 2:
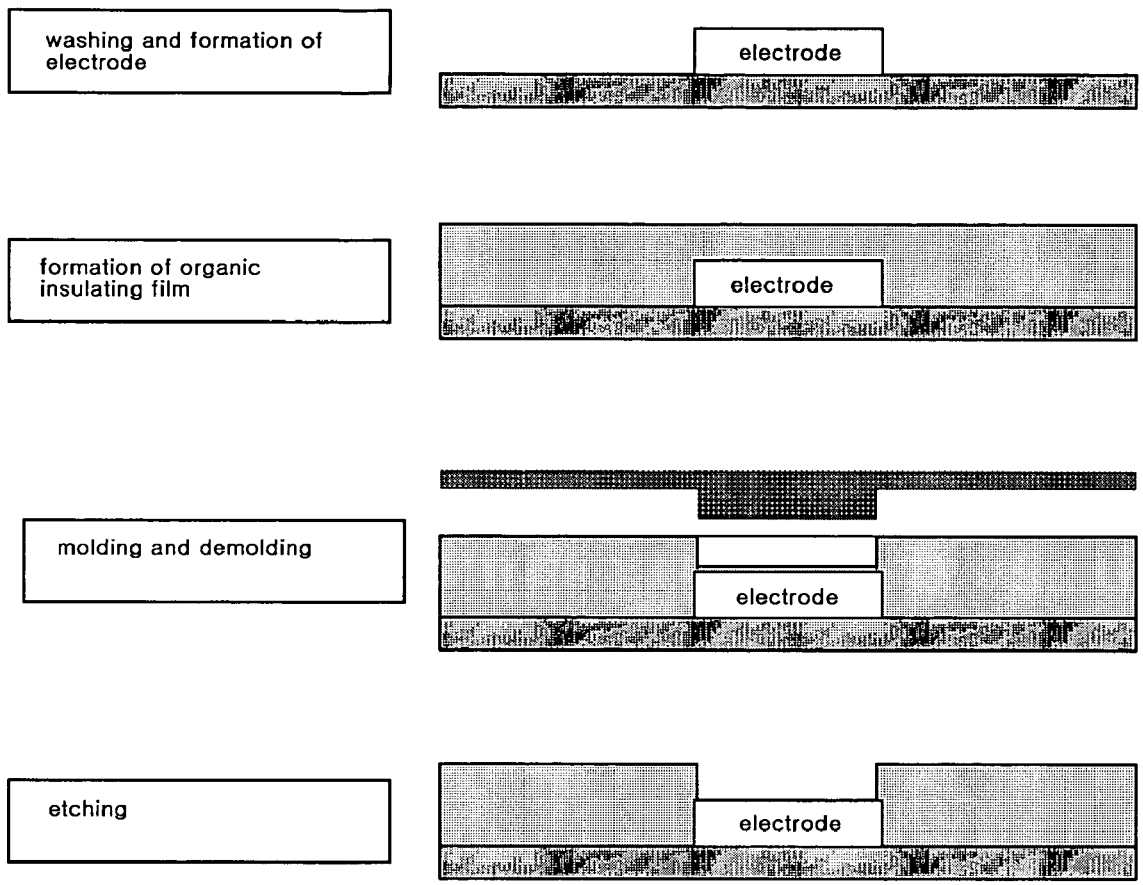
FIG. 2 is a schematic diagrammatic representation illustrating the steps of a method for forming a pattern of an organic insulating film on an electrode connected to a driving circuit according to one embodiment of the present invention.

FIG. 2 is a schematic diagrammatic representation illustrating the steps of a method for forming a pattern of an organic insulating film according to an embodiment of the present invention. The method of an embodiment of the present invention comprises the steps of: i) forming an electrode on a substrate; ii) coating an imprintable composition thereon to form an organic insulating film; iii) pressurizing the organic insulating film using a patterned mold, followed by curing with light and heat, to form a pattern of the organic insulating film; iv) etching a portion of the organic insulating film remaining on the electrode.

Hereinafter, a method according to the embodiments of the present invention will be explained in more detail based on the respective steps.

Step (i):

A substrate is washed to remove impurities by common processes, and an electrode is formed on the washed substrate by deposition or patterning.

Step (ii):

As shown in FIG. 2, an organic insulating film is formed on the structure of step (i) by coating an imprintable composition.

The term "imprintable composition" as used herein refers to a composition capable of forming an organic insulating film on which fine pattern and shape of a mold can be reproduced, marked or transferred by molding.

The imprintable composition comprises at least one compound having a functional group selected from those represented in Formula 1 or 2 below:

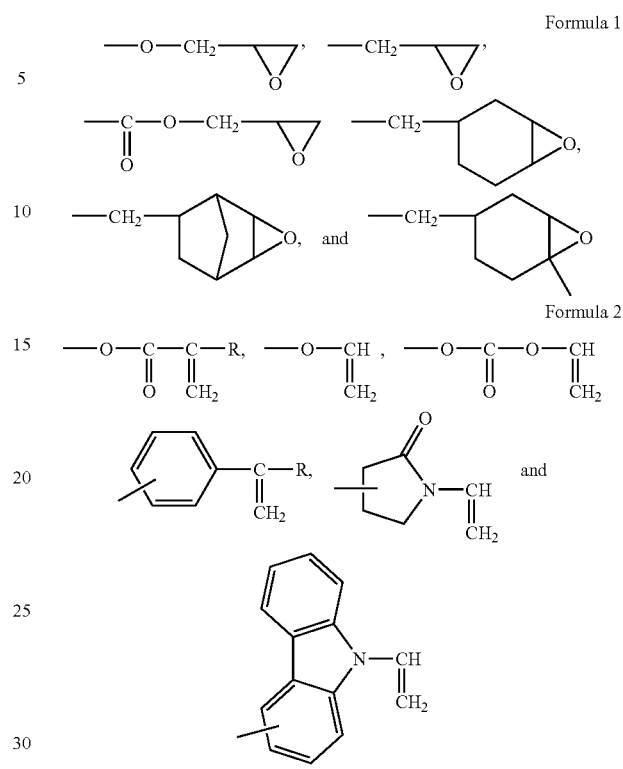

wherein R is hydrogen or methyl.

The imprintable composition used in a method of the embodiments of the present invention can be prepared by mixing the compound having the functional group selected from those represented in Formula 1 or 2, a linear polymer (e.g., polyvinylphenol), and an initiator (e.g., benzoyl peroxide).

The imprintable composition thus prepared is dissolved in an appropriate solvent, such as toluene, 1-methyl-2-pyrrolidinone, acetone, cyclohexanone, tetrahydrofuran, ethylacetate, propylene glycol methyl ether acetate, isopropylalcohol, butylalcohol or perfluoroethane, coated to a thickness of 2,000 to 20,000 Å, and soft-baked at 80 to 150° C. for 10 seconds to 30 minutes.

Step (iii):

The organic insulating film is pressurized and cured using a patterned mold to transfer a pattern of the mold thereto. Specific examples of patterned molds usable in a method of the embodiments of the present invention include molds in which an embossing or intaglio pattern is formed on silicon, glass or plastic substrate. The organic insulating film is pressurized using the mold under a pressure of 0.2 kg/cm²–3 kg/cm² for 2–20 minutes. Then, the pressurized organic insulating film is cured by exposing the film to UV light (365 nm) at 2–20 J/cm² or baking the film at 100–300° C. for 0.5–30 minutes to solidify it. After completion of the curing, the mold is removed.

Step (iv):

Etching is carried out to remove a portion of the organic insulating film remaining on the electrode. Etching can be carried out by common techniques in the art. Specifically, both wet etching using an etching solution, such as acetone, isopropylalcohol, HF, $HNO_3$, $H_3PO_4$, $H_2O_2$ or KOH, and dry etching using an etching gas, such as $SF_6$, HF, $CF_4$, $SiH_4$ or $O_2$, can be employed.

In a method of the embodiments of the present invention, after completion of the etching, a post-treatment process, such as polishing or surface treatment, can be further carried out to smooth and planarize the surface of the organic insulating film. Specifically, the post-treatment process can be carried out by chemically or physically polishing the surface of the organic insulating film using a common slurry or powder aqueous solution, or by forming a self-assembled monolayer (SAM) on the surface of the organic insulating film using a self-assembled single molecule, such as octadecyltrichlorosilane or 3-aminopropyltriethoxysilane.

After formation of a pattern of the organic insulating film, electrodes or an organic semiconductor layer is formed by deposition or patterning to fabricate an organic thin film transistor.

Figure 3:
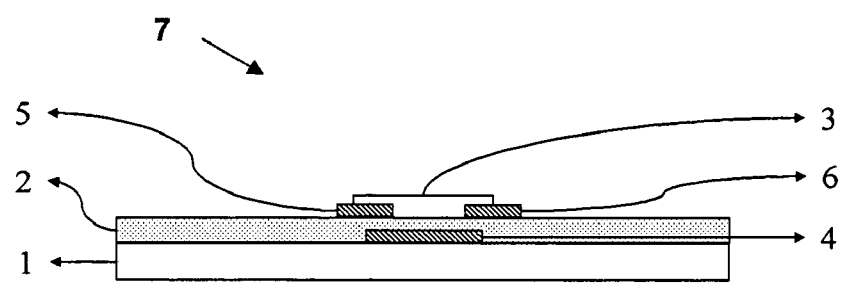
FIG. 3 is a cross-sectional view schematically showing the structure of an organic thin film transistor fabricated in one embodiment of the present invention.

FIG. 3 is a cross-sectional view schematically showing the structure of an organic thin film transistor 7 fabricated in one embodiment of the present invention. Referring to FIG. 3, a gate electrode 4 is formed on a substrate 1, an imprintable composition is coated thereon to form an organic insulating film 2, source/drain electrodes 5 and 6 are formed on the organic insulating film 2, and a semiconductor layer 3 is formed thereon. However, an organic thin film transistor of the embodiments of the present invention is not limited to this structure. For example, the formation order of the gate electrode 4, the organic insulating film 2, the semiconductor layer 3 and the source/drain electrodes 5 and 6 may be changed.

The substrate can be made of, without limitation, glass, silicon, plastic, and other materials known to those skilled in the art.

Examples of suitable materials for the organic semiconductor layer of an organic thin film transistor according to the embodiments of the present invention include, but are not limited to, pentacenes, copper phthalocyanines, polythiophenes, polyanilines, polyacetylenes, polypyrroles, polyphenylene vinylenes, and derivatives thereof.

Suitable materials for the gate electrode and the source/drain electrodes are metals or electrically conductive polymers commonly used in the art, and their specific examples include, but are not limited to, gold (Au), silver (Ag), aluminum (Al), nickel (Ni), molybdenum (Mo), tungsten (W), indium-tin oxides (ITO), polythiophenes, polyanilines, polyacetylenes, polypyrroles, polyphenylene vinylenes, and polyethylenedioxythiophene (PEDOT)/polystyrenesulfonate (PSS) mixtures.

An organic thin film transistor of the embodiments of the present invention can be utilized in the manufacture of display devices, such as electroluminescence devices, liquid crystal devices, and electronic ink devices.

The embodiments of the present invention will now be described in more detail with reference to the following examples. However, these examples are given for the purpose of illustration and are not to be construed as limiting the scope of the invention.

PREPARATIVE EXAMPLE 1

Preparation of Imprintable Composition 2.0 g of trimethylolpropane triglycidyl ether (Aldrich), 0.02 g of triphenylsulfonium triflate (Aldrich), 0.02 g of benzoyl peroxide (Aldrich), and 2.0 g of polyvinylphenol (Aldrich, weight-average molecular weight: 8,000) were dissolved in 18 ml of cyclohexanone to prepare a composition for forming an organic insulating film.

EXAMPLE 1

Formation of Pattern of Organic Insulating Film

Figure 4A:
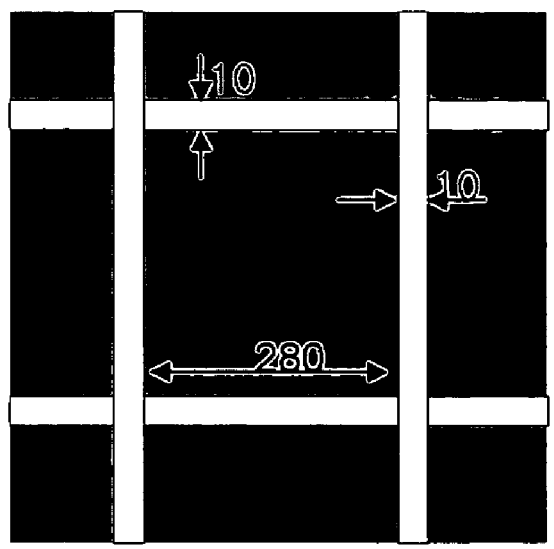
FIG. 4a is a view showing a mold used in Example 1.
Figure 4B:
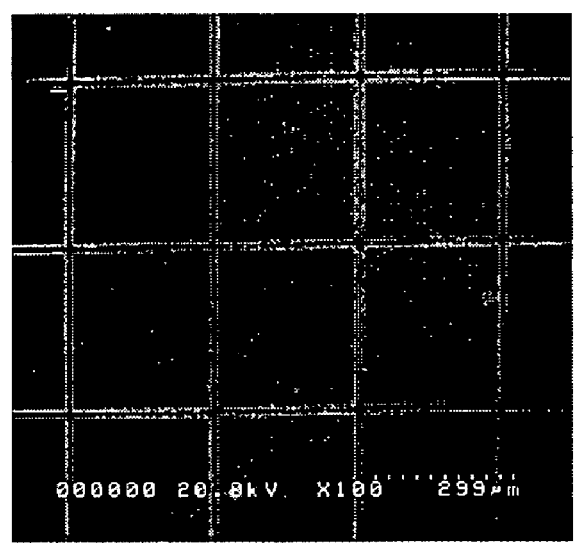
FIG. 4b is an electron micrograph showing a pattern of an organic insulating film formed in Example 1.

The composition for forming an organic insulating film prepared in Preparative Example 1 was spin-coated at 2,000 rpm on a glass substrate to form an organic insulating film having a thickness of 8,000 Å, and soft-baked at 100° C. for 30 seconds. Thereafter, the organic insulating film was pressurized (1 kg/cm$^2$, 10 min.) using the mold shown in FIG. 4$a$, and then UV light (365 nm, 10 J/cm$^2$) was irradiated to cure the organic insulating film, forming the pattern of the organic insulating film shown in FIG. 4$b$.

EXAMPLE 2

Fabrication of Organic Thin Film Transistor

An 800 Å thick gate electrode was formed using molybdenum (Mo) on a glass substrate, and then the composition prepared in Preparative Example 1 was coated thereon in the same manner as in Example 1 to form an organic insulating film. Molding and demolding were carried out on the organic insulating film to form a pattern of the organic insulating film on the electrode connected to a driving circuit.

After the organic insulating film was subjected to dry etching (550 mtorr, 800 W) for 10 seconds using an etching gas of CF$_4$ (200 sccm) and O$_2$ (20 sccm), post-treatment was carried out by exposing the surface of the organic insulating film to 3-aminopropyltriethoxysilane as a self-assembly single molecule for 5 minutes to form a self-assembly monolayer (SAM).

500 Å thick source/drain Au electrodes were formed on the self-assembly monolayer through a shadow mask (channel length: 100 μm, channel width: 1 mm) by vacuum deposition, and then a pentacene organic semiconductor layer (thickness: 700 Å) was formed on the resulting structure by organic molecular beam deposition (OMBD) to fabricate an organic thin film transistor.

Figure 5:
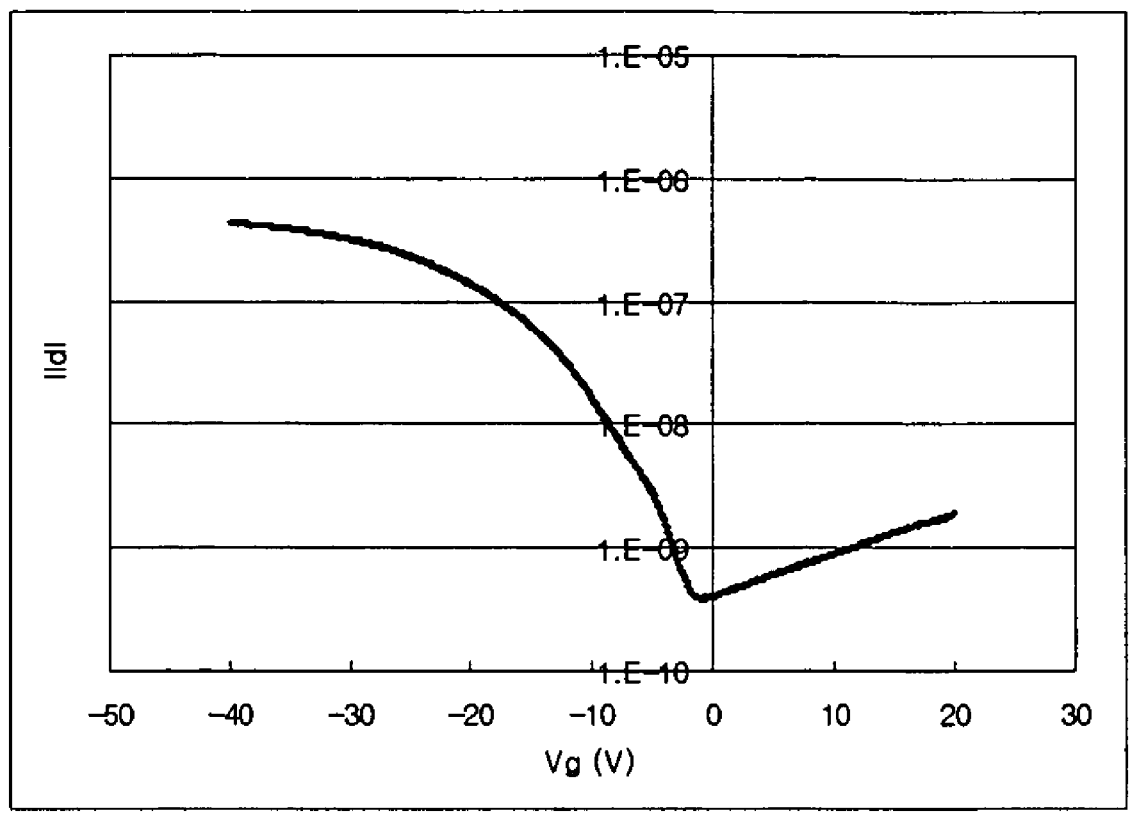
FIG. 5 is a graph showing the current transfer characteristics of an organic thin film transistor fabricated in Example 2.

The current transfer characteristics of the organic thin film transistor were evaluated using a KEITHLEY semiconductor characterization system (4200-SCS), and a curve was plotted (FIG. 5). The electrical properties of the device were measured in accordance with the following procedure. The obtained results are shown in Table 1.

The charge carrier mobility was calculated from the slope of a graph representing the relationship between $(I_{SD})^{1/2}$ and $V_G$ from the following current equations in the saturation region:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

In the above equations, $I_{SD}$: source-drain current, μ and $\mu_{FET}$: charge carrier mobility, $C_o$: capacitance of the oxide film, W: channel width, L: channel length; $V_G$: gate voltage, and $V_T$: threshold voltage.

$I_{on}/I_{off}$ ratio was determined from a ratio of a maximum current in the on-state to a minimum current in the off-state. $I_{on}/I_{off}$ ratio is represented by the following equation:

$$\frac{I_{on}}{I_{off}} = \left(\frac{\mu}{\sigma}\right)\frac{C_o^2}{qN_A t^2}V_D^2$$

wherein $I_{on}$: maximum current, $I_{off}$: off-state leakage current, μ: charge carrier mobility, σ: conductivity of the thin film, q: electric charge, $N_A$: electric charge density, t: thickness of the semiconductor layer, $C_0$: capacitance of the oxide film, and $V_D$: drain voltage.

TABLE 1

| | Charge carrier mobility (cm²/Vs) | $I_{on}/I_{off}$ |
|---|---|---|
| Example 2 | $10^{-2}$ | $10^3$ |

As can be seen from the data shown in Table 1, an organic thin film transistor of the embodiments of the present invention shows superior electrical properties, including high charge carrier mobility.

Although the embodiments of the present invention have been described herein with reference to the foregoing specific examples, these examples do not serve to limit the scope of the embodiments of the present invention. Accordingly, those skilled in the art will appreciate that various modifications and changes are possible, without departing from the technical spirit of the embodiments of the present invention.

As apparent from the above description, an organic insulating film can be patterned using an imprintable composition by simple molding without using a photoresist. Therefore, organic thin film transistors having high charge carrier mobility can be fabricated by simplified procedure at low cost.

What is claimed is:
1. A method for forming a pattern of an organic insulating film comprising:
    forming an electrode on a substrate,
    coating an imprintable composition thereon comprising at least one compound having a functional group selected from those represented in Formula 1 or 2 below:

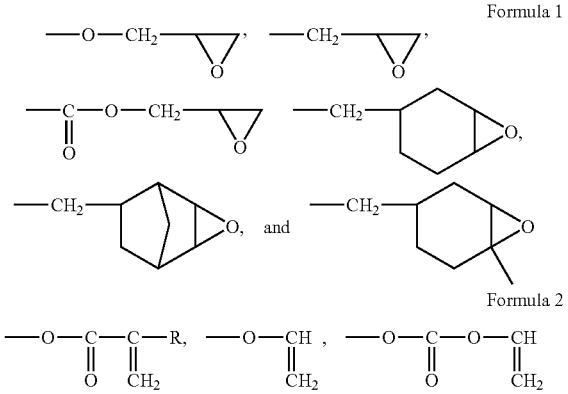

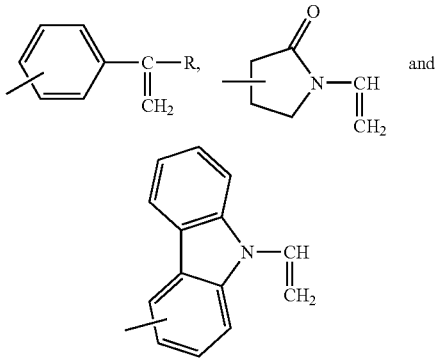

wherein R is hydrogen or methyl, to form an organic insulating film,
    pressurizing and curing the organic insulating film using a patterned mold to transfer a pattern of the mold to the organic insulating film, and
    etching a portion of the organic insulating film remaining on the electrode.

2. The method according to claim 1, further comprising polishing or surface-treating the organic insulating film after the etching.

3. The method according to claim 2, wherein the surface treating is carried out by chemically or physically polishing the surface of the organic insulating film using a slurry or powder aqueous solution, or by forming a self-assembled monolayer on the surface of the organic insulating film using a self-assembled single molecule selected from octadecyltrichlorosilane and 3-aminopropyltriethoxysilane.

4. The method according to claim 1, wherein the imprintable composition is prepared by mixing the at least one of said compound having a functional group selected from those represented in Formula 1 or 2, a linear polymer, and an initiator.

5. The method according to claim 4, wherein the imprintable composition prepared in claim 4 is dissolved in an appropriate solvent selected from the group consisting of toluene, 1-methyl-2-pyrrolidinone, acetone, cyclohexanone, tetrahydrofuran, ethylacetate, propylene glycol methyl ether acetate, isopropyl alcohol, butyl alcohol and perfluoroethane, coated to a thickness of 2,000 to 20,000 Å, and soft-baked at 80° C. to 150° C. for 10 seconds to 30 minutes.

6. The method according to claim 1, wherein the organic insulating film is pressurized under a pressure of 0.2 kg/cm²–3 kg/cm² for 2–20 minutes, and is cured by exposing the film to UV light at 2–20 J/cm² or baking the film at 100–300° C. for 0.5–30 minutes to solidify it.

7. The method according to claim 1, wherein the etching is carried out by wet etching using an etching solution selected from the group consisting of acetone, isopropyl alcohol, HF, $HNO_3$, $H_3PO_4$, $H_2O_2$ and KOH.

8. The method according to claim 1, wherein the etching is carried out by dry etching using an etching gas selected from the group consisting of $SF_6$, HF, $CF_4$, $SiH_4$ and $O_2$.

* * * * *